(12) United States Patent
Kimoto

(10) Patent No.: US 6,396,283 B1
(45) Date of Patent: May 28, 2002

(54) DEVICE FOR DETECTING ABNORMALITY OF SENSOR, AND CONTROL DEVICE FOR VEHICLE

(75) Inventor: Yasuhiro Kimoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 2 days.

(21) Appl. No.: 09/638,068

(22) Filed: Aug. 15, 2000

(30) Foreign Application Priority Data

Mar. 22, 2000 (JP) ........................... 2000-079472

(51) Int. Cl.[7] ................ G01R 31/08; G01R 27/08
(52) U.S. Cl. ................ 324/523; 324/714; 324/713
(58) Field of Search ................ 324/523, 525, 324/522, 713, 714, 705

(56) References Cited

U.S. PATENT DOCUMENTS 5,600,249 A * 2/1997 Yagi et al. ............... 324/525
5,808,461 A * 9/1998 Weigold et al. ........... 324/713

FOREIGN PATENT DOCUMENTS

| JP | 4-83182 | 3/1992 | .......... G01R/31/02 |
| JP | 4-214949 | 8/1992 | .......... F02D/45/00 |

* cited by examiner

Primary Examiner—N. Le
Assistant Examiner—James Kerveros
(74) Attorney, Agent, or Firm—Sughrue Mion, PLLC

(57) ABSTRACT

A main sensor 101a and a subsensor 101b are two sensors adapted to operate in the same direction. A voltage of the same polarity is applied to both the sensors 101a and 101b from a common power supply of a voltage application 100. Then, an offset 103 causes an output value of the subsensor 101b to deviate from an output value of the main sensor 101a by a predetermined value. When the difference between outputs of both the sensors is outside a predetermined range, an abnormality decision 102 decides that an anomaly occurs in the sensor.

8 Claims, 7 Drawing Sheets

DEVICE FOR DETECTING ABNORMALITY OF SENSOR, AND CONTROL DEVICE FOR VEHICLE

BACKGROUND OF THE INVENTION

This invention relates to a device for detecting abnormality of a sensor system and, more particularly, to a device having two variable resistance sensors that are a main sensor, and a subsensor.

Hitherto, a control device having dual input means, which includes a main sensor and a subsensor, has employed the following methods so as to enable a decision on whether or not disconnection occurs in a sensor power supply system or in a sensor GND system. That is, such a control device has employed a method of supplying electric power to the main sensor and the subsensor from different two power supplies, or a method of supplying voltages of opposite polarities to the main sensor and the subsensor from a single common power supply by alternately being connected thereto, as described in the Unexamined Japanese Patent Application Publication Nos. Hei 4-83182 and Hei 4-214949.

FIG. 6 illustrates an example of a conventional control device configured so that electric power is supplied to a main sensor and a subsensor from two different power supplies. A sensor portion 1 has two variable resistance sensors that are a main sensor 11a and a subsensor 11b. A power supply line 13a for the main sensor 11a is connected to a sensor power supply of a calculating portion 2 through a connecting line 21a. A GND line 14a of the main sensor 11a is connected to a sensor GND 24a of the calculating portion 2 through a connecting line 22a. Further, a power supply line 13b for the subsensor 11b is connected to a sensor power supply 23b of the calculating portion 2 through a connecting line 21b. A GND line 14b for the subsensor 11b is connected to a sensor GND 24b of the calculating portion 2 through a connecting line 22b. Moreover, the main sensor 11a and the subsensor 11b are mechanically adapted by a joining member 10 to change in the same direction.

A main-sensor output 12a and a subsensor output 12b are inputted to a processing part 25 of the calculating portion 2. Further, the processing part 25 is operative. to decide whether or not anomalies, such as a disconnection and a short circuit, occur in a sensor system having the main sensor 11a and the subsensor 11b. Further, when it is decided that no anomalies occur in the sensor system, the processing part 25 follows a predetermined procedure and calculates a control variable converted into a digital value and drives a control portion 3. Conversely, when an anomaly occurs in the sensor system, the processing part 25 sets the control variable at a predetermined favorable value for fail safe operation, and drives the control portion 3.

FIG. 7 illustrates characteristics of the main-sensor output 12a and the subsensor output 12b. Incidentally, even in the case that disconnection occurs in the power supply system line (13a, 21a or 23a) or in the GND system line (14a, 22a or 23a) for the main sensor 11a, the subsensor output 12b is normally outputted. Therefore, a failure determination can be performed by comparing the value of the main-sensor output 12a with that of the subsensor output 12b. Additionally, in the case that the power supply system line and the GND system line are used in common between the main sensor and the subsensor, both the main sensor and the subsensor are at the same potential level when a break occurs in, for example, the power supply system line. Thus, there is a fear that such an electric potential level cannot be discriminated from a usual electric potential level. Consequently, the control device requires two line systems for each of the sensors.

However, in the case of the method of supplying electric power to the main sensor 11a and the subsensor 11b from two different power supplies, there is the need for a dual hardware system, that is, two sensor power supplies 23a and 23b and two sensor GNDs 24a and 24b of the calculating portion 2, and two connecting lines (21a, 22a, 21b, 22b) between the calculating portion and the sensor portion.

Further, in the case of the method of supplying voltages of opposite polarities to the main sensor and the subsensor from a single common power supply by alternately being connected thereto, the main-sensor output characteristics are the inverse of the subsensor output characteristics. Thus, when sensor output values are used, there is the necessity for a contrivance to, for example, reverse the output value of one of the sensors.

SUMMARY OF THE INVENTION

This invention is accomplished to solve the aforementioned problems. Accordingly, an object of the present invention is to provide a device for detecting abnormality of a sensor, by which the hardware configuration thereof can be simplified, and in which main-sensor output characteristics are the same as subsensor output characteristics.

According to a first aspect of the present invention, there is provided a device for detecting abnormality of a sensor system, which have two sensors that are a main sensor and a subsensor that operate in the same direction, characterized by comprising voltage application means for applying voltages of the same polarity to both of the main sensor and the subsensor from a common power supply, offset means for causing an output value of the subsensor to deviate from an output value of the main sensor by a predetermined value, and abnormality decision means for deciding, when a difference between the main sensor and the subsensor is outside a predetermined range, that an anomaly occurs in the sensor system.

In the case of a first embodiment of the device according to the first aspect of the present invention, the offset means of the device according to claim 1 comprises a resistor, which has a predetermined resistance value, between the sensor and a sensor power supply or between the sensor and a sensor GND.

In the case of a second embodiment of the device according to the first aspect of the present invention, the offset means of the first embodiment of the device according to the first aspect of the present invention comprises resistors of the same resistance value, which are respectively interposed between the main sensor and the sensor power supply and between the subsensor and the sensor GND.

According to a second aspect of the present invention, there is provided a control device for a vehicle, which comprises the device for detecting abnormality of a sensor according to the first aspect of the present invention, and a control portion, wherein the control portion is driven by calculating, when it is decided that no anomaly occurs in the sensor system, a control variable by following a predetermined procedure, and wherein the control portion is driven by setting, when it is decided that an anomaly occurs in the sensor system, the control variable at a favorable predetermined value for fail safe operation.

DETAILED DESCRIPTION OF THE PREFERRED EMBODIMENTS

First Embodiment

Figure 1:
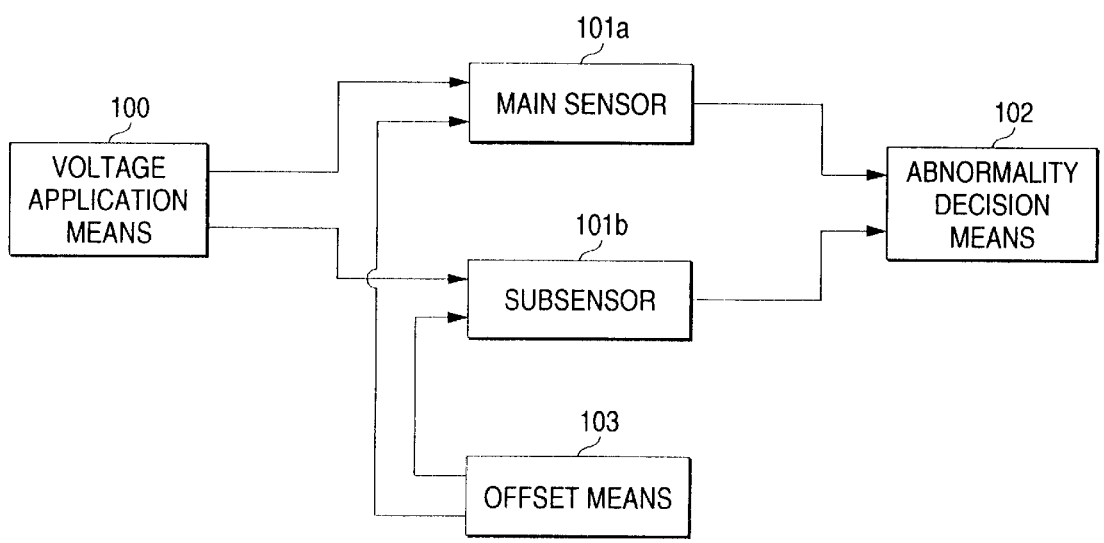
FIG. 1 is a functional block diagram illustrating a device for detecting abnormality of a sensor, which is the first embodiment of invention.

FIG. 1 is a functional block diagram illustrating a device for detecting abnormality of a sensor, which is a first embodiment of this invention. In this system, a main sensor 101a and a subsensor 101b are adapted to operate in the same direction, and constitute a dual sensor system. A voltage of the same polarity is applied from a common power supply of a voltage application means 100 to both the sensors 101a and 101b. Further, an offset means 103 is set so that the value of an output of the subsensor 101b is deviated from the value of an output of the main sensor 101a by a predetermined value. An abnormality decision means 102 receives signals representing the values of outputs of these sensors 101a and 101b. Further, when the difference in output value between these sensors is outside a predetermined range, the abnormality decision means 102 decides that an abnormal condition occurs in a sensor.

Figure 2:
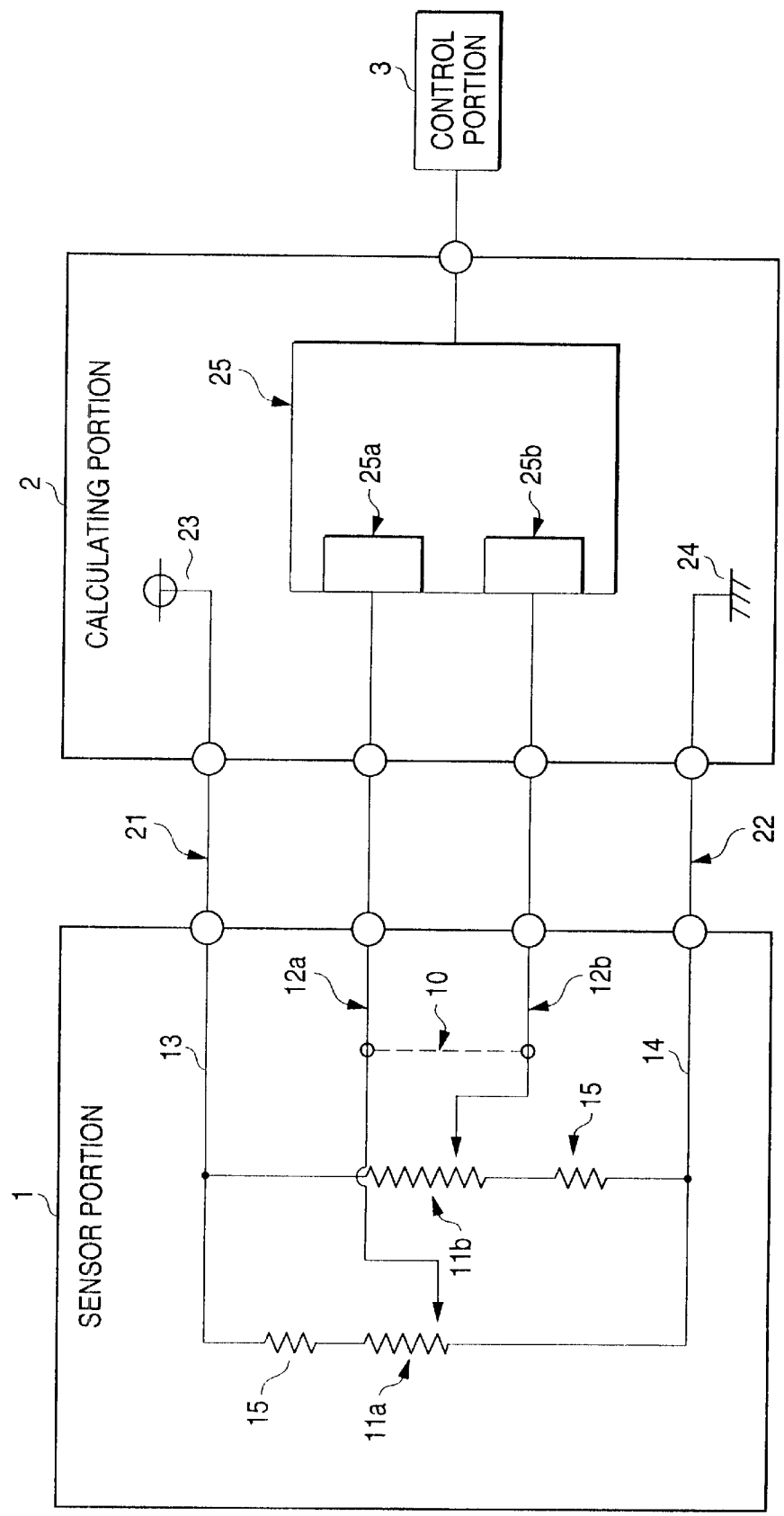
FIG. 2 is a circuit block diagram illustrating an example of a control device to which the device for detecting abnormality of a sensor, namely the first embodiment is applied.

FIG. 2 is a circuit block diagram illustrating a practical example of a circuit to which the device for detecting abnormality of a sensor according to the first embodiment is applied. Incidentally, in the case that such a device is applied to a control device for an automotive engine, a sensor portion 1 is, for example, a device for detecting a throttle opening degree. A calculating portion 2 is a device for calculating a controlled variable corresponding to the throttle opening degree. A control portion 3 is a device for controlling an output of the automotive engine according to the controlled variable.

The sensor portion (namely, a throttle opening degree detecting portion) 1 has two variable resistance sensors, which serve as a throttle sensor and are a main sensor 11a and a subsensor 11b. The main sensor 11a and the subsensor 11b have a common power supply line 13 connected to a sensor power supply 23 of the calculating portion 2 through a connecting line 21. Further, the main sensor 11a and the subsensor 11b have a common GND line 14 connected to a sensor GND 24 of the calculating portion 2 through a connecting line 22.

The main sensor 11a and the subsensor 11b are adapted by a mechanical joining member 10 to change in the same direction as a throttle (not shown). A main-sensor output 12a and a subsensor output 12b are of the same polarity.

A resistor 15 having a resistance value R is connected between the main throttle sensor 11a and the power supply line 13. Further, a resistor 15 having the same resistance value R is connected between the sub-throttle-sensor 11b and the GND line 14. These resistors 15 installed in such a manner correspond to the offset means 103 of FIG. 1 for causing the value of an output of the subsensor 101b to deviate from the value of an output of the main sensor 101a.

The main-sensor output 12a and the subsensor output 12b are inputted to a processing part 25 of the calculating portion 2. Practically, the main-sensor output 12a and the subsensor output 12b are converted into digital signals by A/D converters 25a and 25b incorporated in the processing part 25, respectively. The processing part 25 consists of, for example, CPU, RAM, and ROM, and functions as an abnormality decision means (designated by 102 in FIG. 1) for deciding whether or not abnormal conditions occur in the main sensor 11a and the subsensor 11b and whether or not anomalies, such as a disconnection and a short circuit, occur in the lines extending therefrom to the sensor power supply 23 and the sensor GND 24. Further, when it is decided that no anomalies occur in the sensor system, the processing part 25 follows a predetermined procedure and calculates a control variable corresponding to the throttle opening degree converted into a digital value and drives the control portion 3 for controlling an output of the internal combustion engine of an automobile. Conversely, when an anomaly occurs in the sensor system, the processing part 25 sets the control variable at a predetermined favorable value for fail safe operation, and drives the control portion 3.

Figure 3:
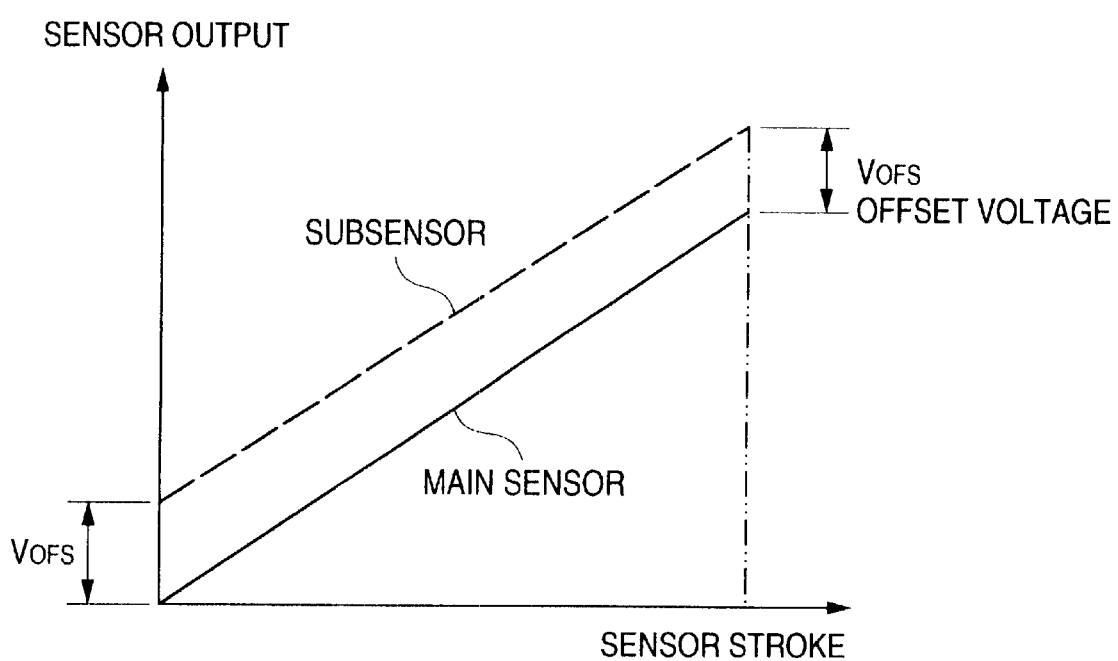
FIG. 3 is a graph illustrating output characteristics of a main sensor and a subsensor of the first embodiment.

FIG. 3 illustrates output characteristics of the main sensor 11a and the subsensor 11b of the first embodiment. Because of the fact that the main sensor 11a is connected to the power supply line 13 through the resistor of the resistance value R and that the subsensor 11b is connected to the GND line 14 through the resistor 15 of the same resistance value R, the subsensor output value 12b is usually higher than the main-sensor output value 12a by a partial voltage generated across the offset resistor 15 (that is, an offset voltage $V_{OFS}$). Incidentally, for instance, in the case that a break occurs in the connecting line 21 for connecting the power supply line 13 to the sensor power supply 23, both the subsensor output value 12b and the main-sensor value 12a become at the same level as the electric potential at the sensor GND 24. Thus, a voltage, which is higher than an output of the main sensor by a partial voltage generated across the offset resistor 15, is not outputted.

Figure 4:
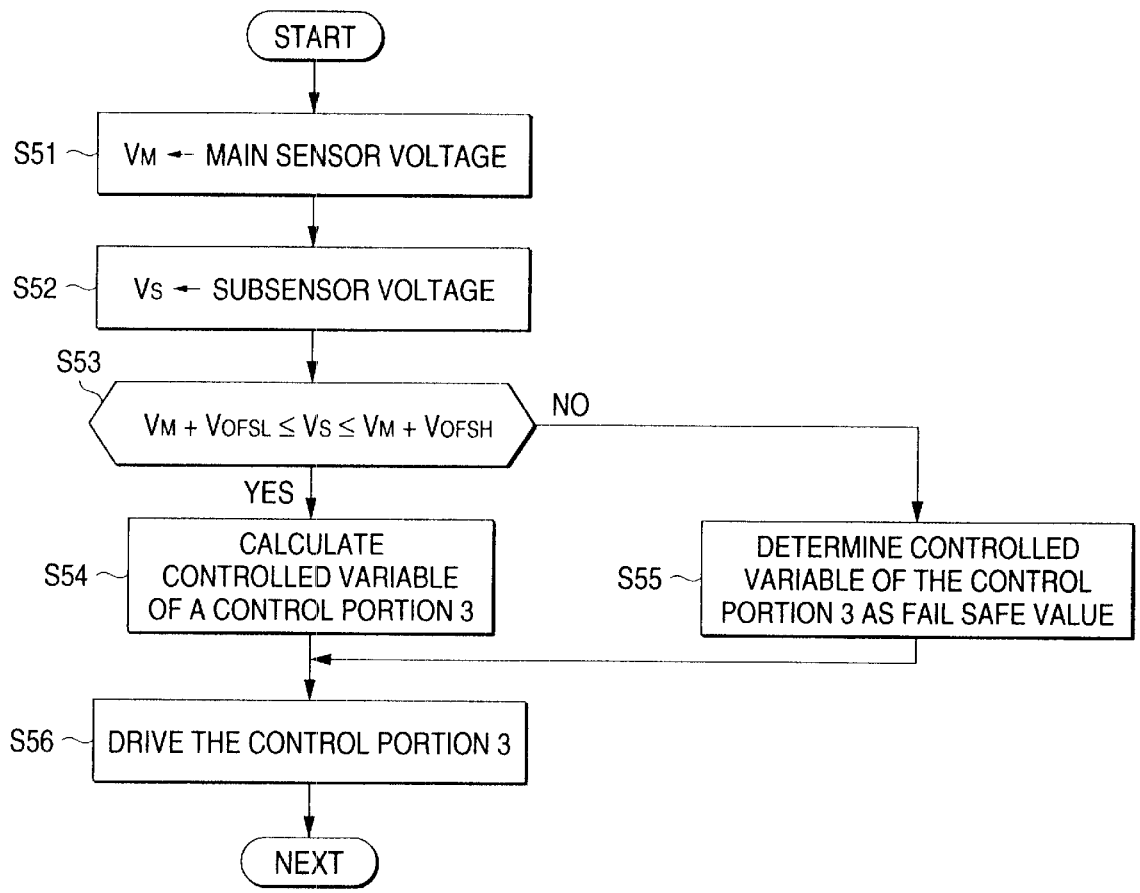
FIG. 4 is a flowchart illustrating an operation of detecting abnormality of a sensor, which is performed by the first embodiment.
Figure 5:
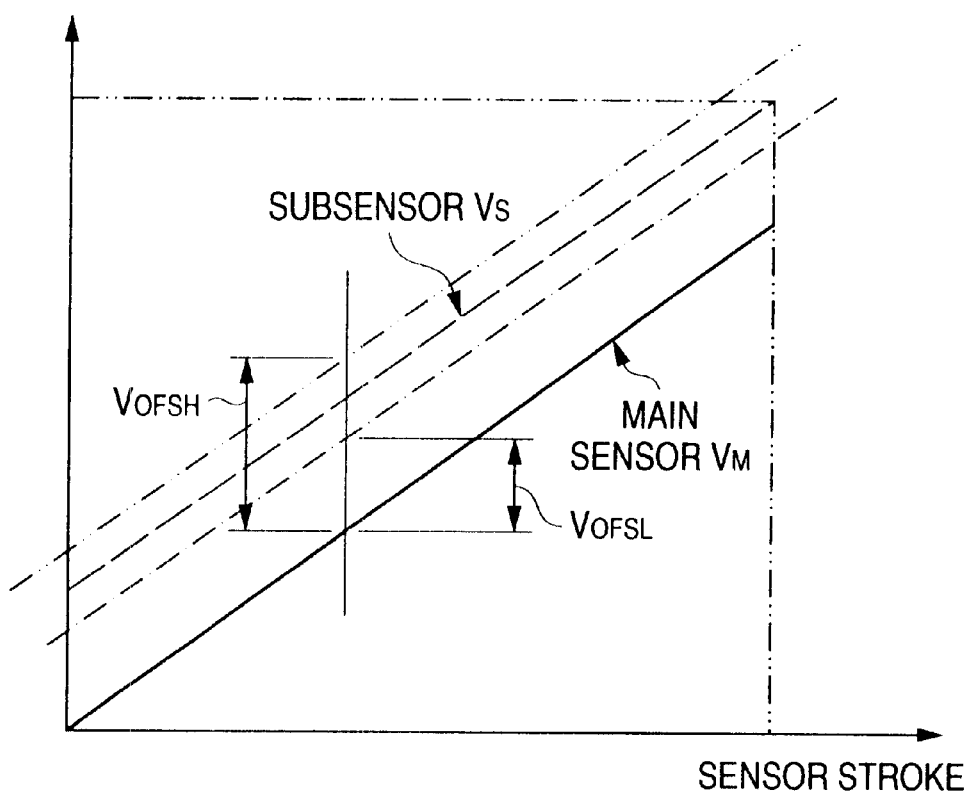
FIG. 5 is a graph illustrating sensor output characteristics, which are a reference for detecting abnormality of the sensor by the first embodiment.
Figure 6:
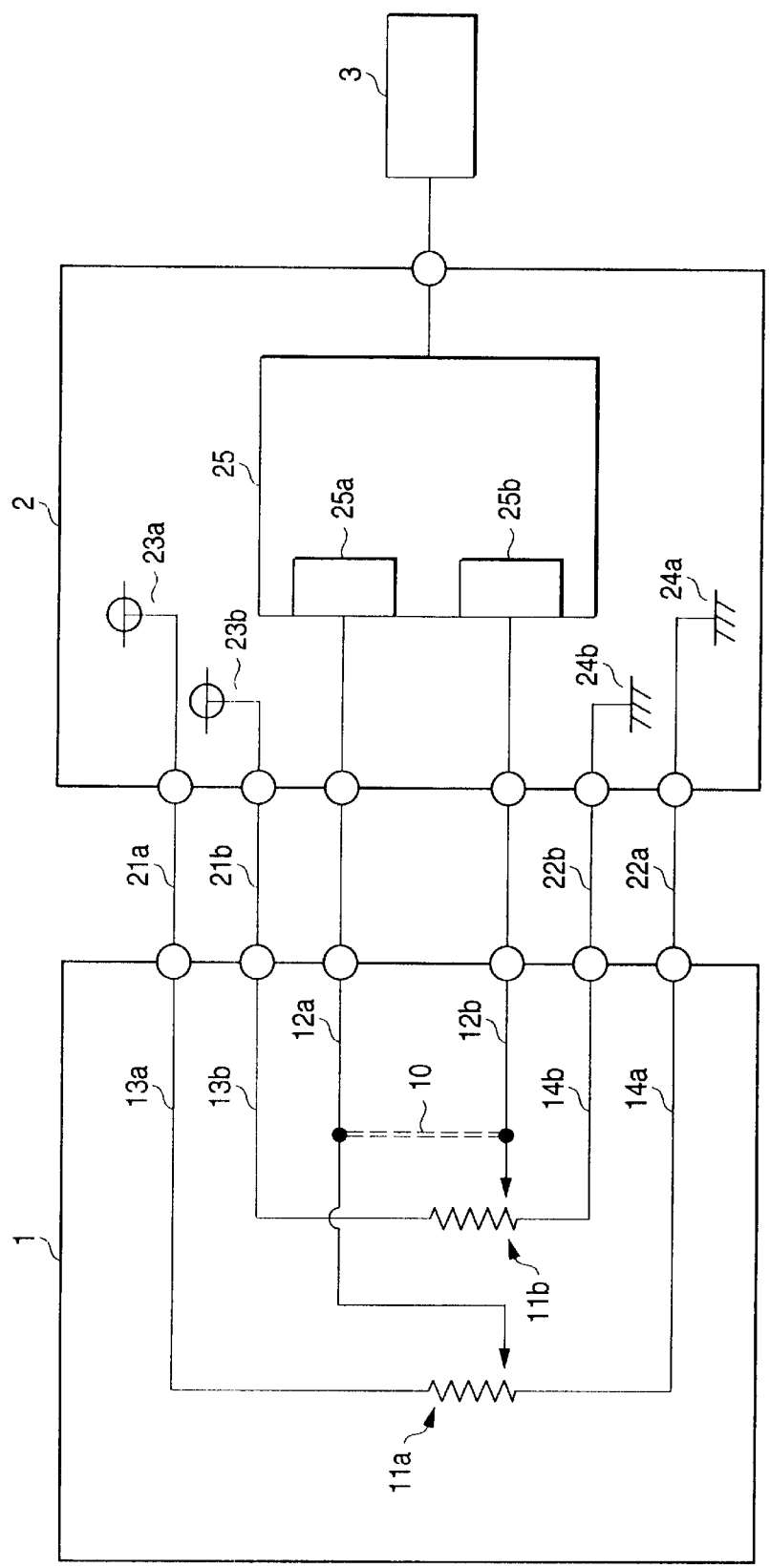
FIG. 6 is a circuit block diagram illustrating an example of a control device to which a conventional device for detecting abnormality of a sensor is applied.
Figure 7:
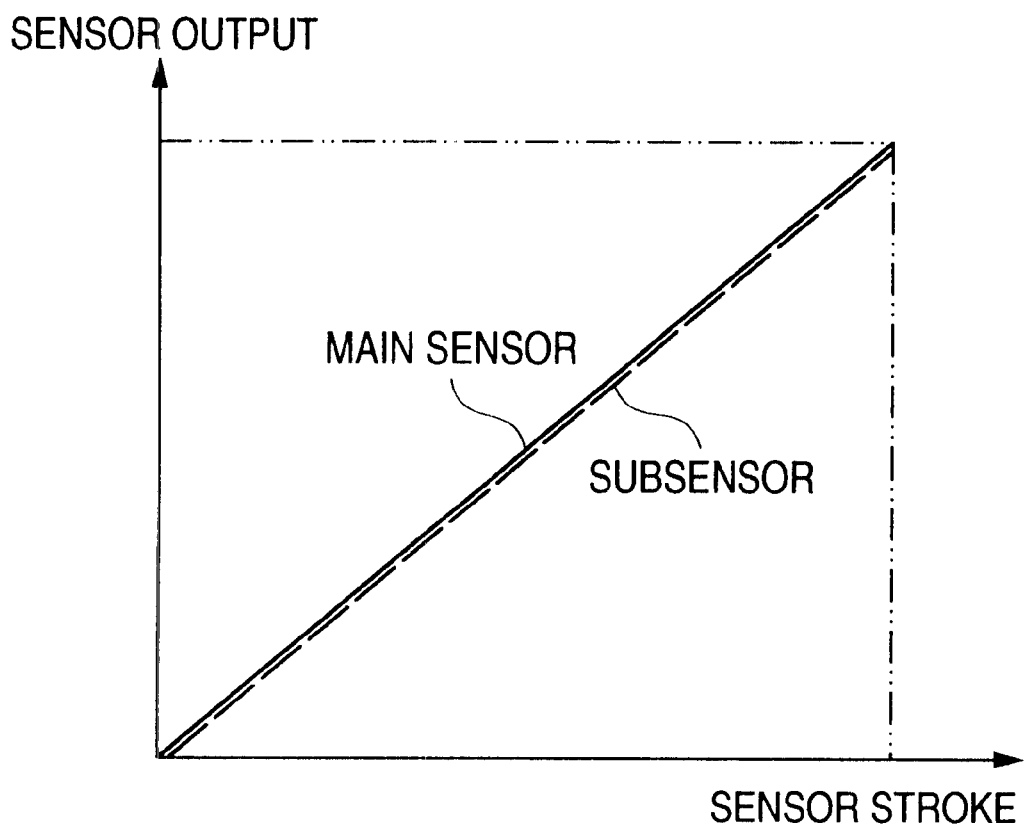
FIG. 7 is a graph illustrating output characteristics of a main sensor and a subsensor of a conventional device for detecting abnormality.

FIG. 4 is a flowchart illustrating an operation of detecting abnormality of a sensor to be performed in the first embodiment. More specifically, this figures shows a flowchart of a control operation performed by the processing part 25 of the calculating portion 2. At step S51, the main-sensor output value 12a is converted by an A/D converter 25a of the processing part 25 into a digital value $V_M$. Then, at step S52, the subsensor output value 12b is converted by an A/D converter 25b into a digital value $V_S$.

Subsequently, at step S53, it is decided whether the converted subsensor output value $V_S$ is equal to or higher than a sum of the converted main-sensor-output value $V_M$ and a predetermined value $V_{OFSL}$ and equal to or lower than a sum of the converted main-sensor-output value $V_M$ and a predetermined value $V_{OFSH}$. That is, when the value $V_S$ meets this condition, the subsensor output value 12b is regarded as being outputted in such a manner as to be higher than the main-sensor output value 12a by the partial voltage generated across the offset resistor 15. It is, thus, decided that both the sensors are normal. Consequently, control advances to step S54, whereupon the control variable of the control portion 3 is calculated. Then, at step S56, the control portion 3 is driven. Conversely, when the value $V_S$ does not meet the condition at step S53, it is decided that an anomaly occurs in the sensor system. Thus, control proceeds to step S55, whereupon the control variable of the control portion 3 is set at a favorable value for fail safe operation. Subsequently, control advances to step S56, whereupon the control portion 3 is driven.

In the aforementioned embodiment, the sensor system is used as a throttle sensor. However, the present invention can be applied to the case of employing a device for outputting an output signal of a sensor indicating the operational state of the internal combustion engine. Additionally, in the aforementioned embodiment, an engine control device is used as the control portion. However, in the case of employing a transmission control device or other vehicle-mounted control devices as the control portion, similar effects can be obtained.

As described above, according to the first aspect of the present invention, there is provided a device for detecting abnormality of a sensor system, which has two sensors that are a main sensor and a subsensor that operate in the same direction, characterized by comprising voltage application means for applying voltages of the same polarity to both of the main sensor and the subsensor from a common power supply, offset means for causing an output value of the subsensor to deviate from an output value of the main sensor by a predetermined value, and abnormality decision means for deciding, when a difference between the main sensor and the subsensor is outside a predetermined range, that an anomaly occurs in the sensor system. Further, in the case of a first embodiment of the device according to the first aspect of the present invention, the offset means of this device comprises a resistor, which has a predetermined resistance value, between the sensor and a sensor power supply or between the sensor and a sensor GND. Moreover, in the case of a second embodiment of the device according to the first aspect of the present invention, the offset means of the first embodiment of the device according to the first aspect of the present invention comprises resistors of the same resistance value, which are respectively interposed between the main sensor and the sensor power supply and between the subsensor and the sensor GND. Thus, according to the present invention, the output characteristics of the main sensor are the same as those of the subsensor. Furthermore, the present invention has the effects of simplifying the hardware configuration of the device.

According to a second aspect of the present invention, there is provided a control device for a vehicle, which comprises the device for detecting abnormality of a sensor according to the first aspect of the present invention, and a control portion, wherein the control portion is driven by calculating, when it is decided that no anomaly occurs in the sensor system, a control variable by following a predetermined procedure, and wherein the control portion is driven by setting, when it is decided that an anomaly occurs in the sensor system, the control variable at a favorable predetermined value for fail safe operation. Thus, the present invention provides a control device that can cope with the abnormality of the sensor system by a device of a simplified hardware configuration.

What is claimed is:

1. A device for detecting abnormality in a dual sensor system including a main sensor and a subsensor that operate in a same direction, said device comprising:

voltage application means for applying voltages of a same polarity to both of said main sensor and said subsensor from a common power supply;

offset means for causing an output value of said subsensor to deviate from an output value of said main sensor by a predetermined amount; and abnormality decision means for deciding, when a difference between said output value of said main sensor and said deviated output value of said subsensor is outside a predetermined range, that an abnormality exists in said dual sensor system.

2. The device for detecting abnormality according to claim 1, wherein said offset means comprises a resistor, which has a predetermined resistance value and which is provided between said sensor and a sensor power supply or between said sensor and a sensor GND.

3. The device for detecting abnormality of a sensor according to claim 1, wherein said offset means comprises two resistors of a same resistance value, which are respectively interposed between said main sensor and said sensor power supply and between said subsensor and said sensor GND.

4. A device for detecting abnormality according to claim 1, further comprising a control portion, wherein:

said control portion is driven by calculating, when it is decided that no abnormality exists in said sensor system, a control variable by following a predetermined procedure; and said control portion is driven by setting, when it is decided that an abnormality exists in said sensor system, the control variable at a predetermined value for fail safe operation.

5. A device for detecting abnormality according to claim 4, wherein said control portion is operative to control an automotive engine according to the control variable.

6. A device for detecting abnormality according to claim 1, further comprising a plurality of analog-to-digital converters that are operative to convert said output values into digital signals.

7. A device for detecting abnormality according to claim 1, wherein said dual sensor system is operative to detect a throttle opening amount.

8. A device for detecting abnormality according to claim 1, wherein said main sensor and said subsensor are variable-resistance type sensors.

* * * * *